United States Patent
Huang et al.

(10) Patent No.: US 6,872,972 B2
(45) Date of Patent: Mar. 29, 2005

(54) METHOD FOR FORMING SILICON FILM WITH CHANGING GRAIN SIZE BY THERMAL PROCESS

(75) Inventors: Chih Yuan Huang, Hsinchu (TW); Jonason Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 13 days.

(21) Appl. No.: 10/621,120

(22) Filed: Jul. 16, 2003

(65) Prior Publication Data

US 2005/0012136 A1 Jan. 20, 2005

(51) Int. Cl.$^7$ ............................................. H01L 29/04
(52) U.S. Cl. .............................. 257/52; 257/2; 257/3; 257/4; 257/5; 257/55; 257/63; 257/315; 438/482; 438/488; 438/674; 438/764
(58) Field of Search ............................. 257/2–5, 52–63, 257/315, 646; 438/482, 488, 674, 764

(56) References Cited

U.S. PATENT DOCUMENTS

| | | | |
|---|---|---|---|
| 4,748,133 A | * | 5/1988 | Griswold ..................... 438/264 |
| 4,945,393 A | | 7/1990 | Beltram et al. |
| 4,963,506 A | * | 10/1990 | Liaw et al. .................. 438/482 |
| 5,017,308 A | | 5/1991 | Iijima |
| 5,017,980 A | | 5/1991 | Gill et al. |
| 5,147,813 A | | 9/1992 | Woo |
| 5,445,982 A | | 8/1995 | Hwang |
| 5,711,998 A | | 1/1998 | Shufflebotham |
| 5,751,637 A | | 5/1998 | Chen et al. |
| 5,753,134 A | | 5/1998 | Biebl |
| 5,863,706 A | | 1/1999 | Komatsu et al. |
| 5,874,129 A | | 2/1999 | Beinglass et al. |
| 5,972,765 A | | 10/1999 | Clark et al. |
| 6,013,551 A | | 1/2000 | Chen et al. |
| 6,023,093 A | | 2/2000 | Gregor et al. |
| 6,114,722 A | | 9/2000 | Jan et al. |
| 6,143,632 A | | 11/2000 | Ishida et al. |
| 6,218,246 B1 | | 4/2001 | Xiang et al. |
| 6,221,705 B1 | | 4/2001 | Rost et al. |
| 6,268,068 B1 | | 7/2001 | Heuer et al. |
| 6,268,086 B1 | * | 7/2001 | Honbo et al. ............ 429/231.8 |
| 6,326,274 B2 | | 12/2001 | Rost et al. |
| 6,373,092 B1 | | 4/2002 | Okumoto |
| 6,670,241 B1 | | 12/2003 | Kamal et al. |
| 2004/0077155 A1 | * | 4/2004 | Chen et al. ................ 438/478 |

OTHER PUBLICATIONS

Kwon, Hyungshin et al., "Electrical Characteristics of Ultrathin Gate Oxide Prepared by Postoxidation Annealing in ND3," Applied Physics Letters, 76 (6): 772–773 (Feb. 7, 2000).

U.S. Appl. No. 10/180,168, filed Jun. 26, 2002, Luoh.

Kahler, U., et al. "Size related properties of silicon nanoparticles from decomposition of SiOx" http://www.mpi–halle.mpg.de/annual_reports/2000.pdf/jb_results_14.pdf, 2 pages.

(Continued)

*Primary Examiner*—Michael Tran
*Assistant Examiner*—Andy Huynh
(74) *Attorney, Agent, or Firm*—Haynes, Beffel & Wolfeld LLP

(57) ABSTRACT

Roughly described, a silicon layer transitions from polysilicon at one surface to amorphous silicon at the opposite surface. The transition can be monotonic, and can be either continuous or it can change abruptly from polysilicon to amorphous silicon. If such a layer is formed as the floating gate of a floating gate transistor structure, the larger grain structure adjacent to the tunnel dielectric layer reduces the formation of a tip (protrusion) and thus reduces leakage. On the other hand, the smaller grain structure adjacent to the gate dielectric layer produces a smooth, more uniform gate dielectric layer. The polysilicon-to-amorphous silicon transistor can be fabricated with a temperature profile that favors polysilicon formation at the start of floating gate deposition, and transitions during deposition to a temperature that favors amorphous silicon deposition at the end of floating gate deposition.

8 Claims, 6 Drawing Sheets

OTHER PUBLICATIONS

"Polysilicon: The Successor Technology," http://www.w-tec.org/loyola/dsply_jp/c5_s5.htm (June 1992), 3 pages.

Polysilicon TFT, The Future is clear with Toshiba, http://www.toshiba-europe.com/computers/tnt/tft/ (2002), 1 page.

Higher Resolution, The Future is clear with Toshiba, http://www.toshiba-europe.com/computers/tnt/tft/resolution.htm (2002), 1 page.

Polysilicon Explained, The Future is clear with Toshiba, http://www.toshiba-europe.com/computers/tnt/tft/explained.htm (2002), 1 page.

"Flash Memory Technology" Chapter 10, Integrated Circuit Engineering Corporation, http://smithsonianchips.si.edu/ice/cd/MEMORY97/SEC10.PDF (1997), pp. 10–1 through 10–16.

Wilson, Ron, "Flash gets a quantum makeover at IEDM," EETIMES (Dec. 13, 2002), 4 pages.

"The K–Input Floating–Gate MOS (FGMOS) Transistor" http://people.ece.cornell.edu/minch/talks/FGMOSTdevicelayout.pdf, 22 pages.

Dipert, Brian, "Exotic Memories, diverse approaches" www.ednmag.com (Apr. 26, 2001), 9 pages.

Lammers, David, "Chip makers bang away at metal gates" EETIMES (Nov. 26, 2002), 3 pages.

"Characterizing Very Thin ONO Gates with Laser Spectroscopic Ellipsometry" Rudolph Technologies, Inc. Application Reports (2001) http://www.rudolphtech.com/reports/VeryThinONOGates.htm, 3 pages.

Dorsch, Jeff, "Applied Debuts RTP System, Company also adds CMP Process, defect detection system" Electronic News (Sep. 20, 1999), 3 pages.

* cited by examiner

METHOD FOR FORMING SILICON FILM WITH CHANGING GRAIN SIZE BY THERMAL PROCESS

BACKGROUND OF THE INVENTION

The present invention relates to the field of semiconductor device fabrication, and to the formation within such devices of silicon microstructures through the use of chemical vapor deposition, dopant implantation, feature patterning and etching, and other fabrication techniques. Furthermore, polysilicon is a material widely used in microelectronic devices, and the present invention relates to certain fabrication methods and device structures that may require the use of polysilicon. More particularly, in certain memory devices, polysilicon may be employed for floating gates of transistors used to form a storage array. In memory device applications of this type, the transistor floating gates are used to store and retain a plurality of electrical charges in accordance with the data being written. Subsequent read operations may then be performed on a device to retrieve stored data when it is needed.

In the manufacture of semiconductor devices, the structure of silicon may take different forms with respect to its crystalline properties. For example, in the form of ingots for the production of wafers, the preferred silicon structure is primarily monocrystalline, because this structure has the fewest number of crystal lattice faults, and this is desirable for the fabrication of semiconductor devices. On the other hand, silicon may also be fabricated in the form of polycrystalline or amorphous silicon, with crystalline lattices that include large numbers of grains with varying orientations and sizes. Moreover, the temperature, pressure, presence or absence of dopants, and other factors controlled in the fabrication of silicon can be used to determine the crystalline and other properties of the resulting silicon structures.

Multi-layer assemblies including polysilicon may be used in the fabrication of semiconductor devices. Certain types of multi-layer assemblies may be formed by the vapor deposition of one or more layers, which may then be further processed by patterning and etching techniques, to produce various device structures. When polysilicon transistor floating gate structures are manufactured in this manner, it is desirable that they have certain electrical and physical properties, in order to promote their ability to store and retain electrical charges.

Furthermore, unwanted loss by leakage of the charge stored on a transistor's floating gate may lead to the loss of stored data, and therefore is an undesirable event. Accordingly, it is advantageous to minimize the floating-gate leakage currents of a storage transistor, and thereby to increase its long-term ability to store data. Thus, the observed problem of the degradation of data retention can be attributed in part to the loss of gate charge by leakage.

One possible mechanism of charge loss from the floating-gate may involve charge leakage across the tunnel dielectric, from the floating gate to the channel or substrate. Thus, one factor that could contribute to the occurrence of the floating-gate stored charge loss by leakage would be the strength of the electric field across the tunnel dielectric. Moreover, in order to improve the data retention of a floating gate transistor, there exists a need for methods and structures that may help reduce the electric fields caused by a stored charge.

SUMMARY OF THE INVENTION

After etching it is desirable that polysilicon floating gate elements have lateral walls that are as smooth as possible. Stated another way, it is desirable to minimize any physical protrusions, also known as "tips", which may be formed on the lateral walls. This is true, because it is believed that such protrusions or tips, especially when located near the tunnel oxide layer, result in increased electric fields, and therefore, increased leakage of the charge stored on the floating gate, thus impairing the gate's ability to retain a stored data value over time.

On the other hand, it is also desirable to form smooth ONO ($SiO_2$/Silicon Nitride) dielectric layers superposed on the upper surfaces of the polysilicon floating gate elements. Thus, during fabrication of a floating gate, it is desirable that the upper surface of the gate be as smooth as possible, because this provides for the superposition onto this surface of a smoother and more uniform control gate dielectric layer.

Floating gate elements with smooth lateral walls without "tips" can be fabricated by the deposition of "grainy" polysilicon. However, polysilicon floating gates made in this manner have an upper surface that is rough, rather than smooth as desired. Floating gates with smooth upper surfaces can be fabricated using amorphous silicon, but in this case, their lateral walls may have "tips" in the regions adjacent to the ONO tunnel oxide layer, which are undesirable because, being protrusions, their physical characteristics cause an increase in the strength of the electric fields across the tunnel dielectric. It is desirable to minimize the strength of the electric field between the floating gate and the substrate, because an increase in field strength causes a greater loss by leakage of the charge stored in the floating gate.

Accordingly, there is a need for techniques that improve the manufacture of transistor floating gates, wherein the floating gates exhibit the desired properties of smoother lateral walls with reduced "tips" adjacent to their ONO tunnel oxide layers, and which also have smoother upper surfaces adjacent to their control gate dielectric layer.

The present invention is directed to improved methods for the manufacture of polysilicon transistor floating gate microstructures having smooth lateral walls after etching, with reduced "tip" formation adjacent to the ONO tunnel oxide layer; and wherein the floating gate elements have smooth upper surfaces after deposition, resulting in improved ONO gate oxide layer deposition. Thus, the present invention is directed to techniques and methods for the fabrication of single- and multi-layer transistor floating gate structures with improved electrical and physical characteristics. Furthermore, the present invention can be utilized for the manufacture of devices having improved floating gate structures as disclosed herein.

Roughly described, the seemingly contradictory objectives of reduced tip adjacent the tunnel dielectric layer and increased smoothness adjacent the gate dielectric layer can both be achieved by forming a silicon layer that transitions from polysilicon at one surface to amorphous silicon at the opposite surface. The transition can be monotonic, and can be either continuous or it can change abruptly from polysilicon to amorphous silicon. If such a layer is formed as the floating gate of a floating gate transistor structure, the larger grain structure adjacent to the tunnel dielectric layer can reduce the formation of a tip and thus reduces leakage. On the other hand, the smaller grain structure adjacent to the gate dielectric layer can produce a smoother, more uniform gate dielectric layer. The polysilicon-to-amorphous silicon transistor can be fabricated with a temperature profile that favors polysilicon formation at the start of floating gate deposition, and transitions during deposition to a temperature that favors amorphous silicon deposition at the end of floating gate deposition.

Particular aspects of the present invention are further described in the claims, specification, and drawings that follow.

DETAILED DESCRIPTION

The following detailed description is made with reference to the figures. Certain embodiments are described to illustrate the present invention, not to limit its scope, which is defined by the claims. Those of ordinary skill in the art will recognize a variety of equivalent variations on the description that follows.

A semiconductor device may be fabricated by processes that include the formation of multi-layer assemblies through vapor deposition onto a substrate structure. In addition, the electrical properties of the multi-layer assemblies used to form device microstructures can be modified during deposition by the selective inclusion of other elements or compounds during or after the deposition process, to obtain results referred to as "doping."

Figure 1:
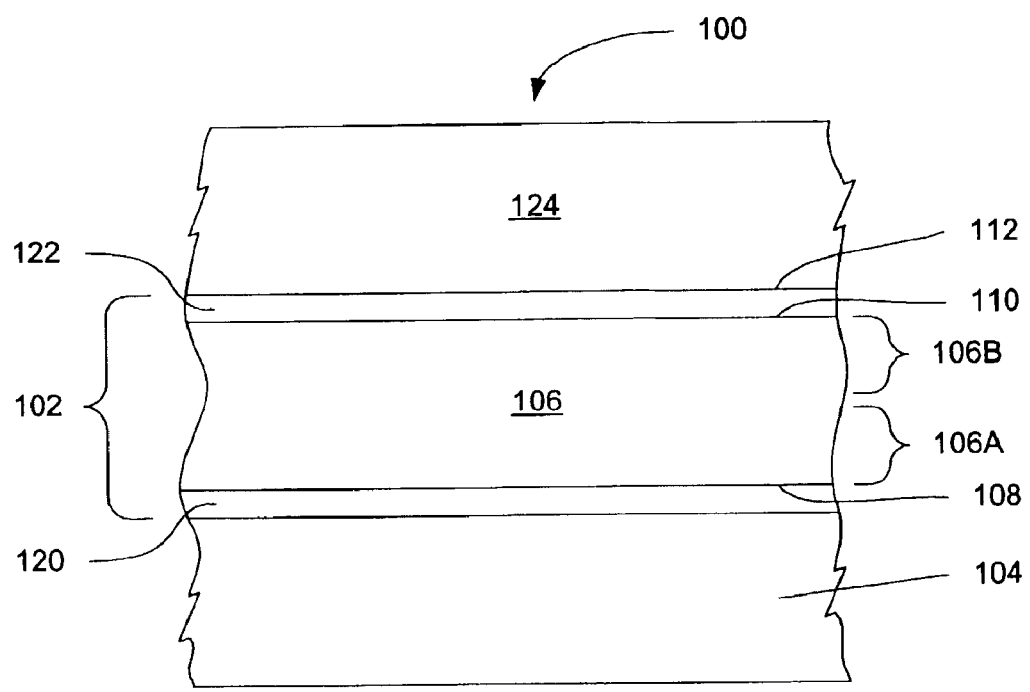
FIG. 1 is a cross-section diagram of a silicon device structure.

FIG. 1 is a cross-section diagram of a silicon device structure 100, incorporating features of the invention. The structure comprises a substrate 104, a multi-layer assembly 102 superposed on the substrate, and at least one additional layer 124 superposed on the upper surface 112 of the multi-layer assembly. The multi-layer assembly comprises a first layer 106 further comprising a first surface 108, a second surface 110, a first region 106A adjacent to the first surface, and a second region 106B adjacent to the second surface. The multi-layer assembly further comprises a second layer 120 adjacent to the first surface, and a third layer 122 adjacent to the second surface.

Figure 2:
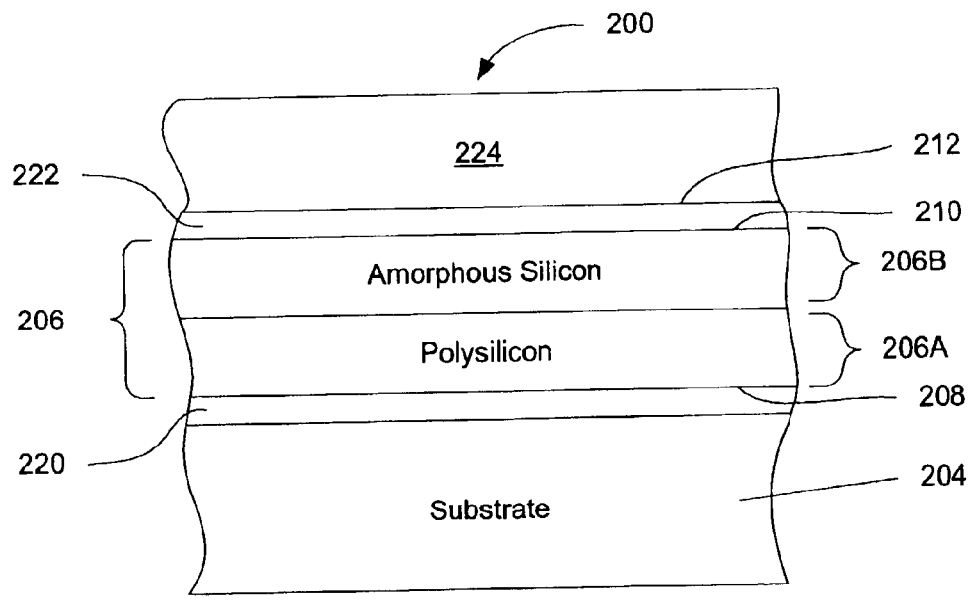
FIG. 2 is a cross-section of a multi-layer assembly including layers formed by deposition in accordance with one embodiment of the invention.

FIG. 2 illustrates the cross-section of a multi-layer assembly 200 in one embodiment of the invention. The assembly comprises a substrate assembly 204, on which a first layer 220 is superposed, and the first layer may comprise a dielectric such as an ONO layer, or may comprise another layer composition. According to an aspect of the invention, second layer 206 is superposed on first layer 220 by deposition, and the second layer comprises a first region 206A comprising polysilicon, and a second region 206B, comprising amorphous silicon, is superposed onto the first region by deposition. A third layer 222, comprising a dielectric such as an ONO layer or another layer composition, is superposed on the second layer. Formation of the multi-layer assembly 200 includes deposition of the polysilicon first region 206A at a temperature of about 620° C., and deposition of the amorphous silicon second region 206B at about 520° C.

The depiction in FIG. 2 of multi-layer assembly 200 is not limiting. Substrate assembly 204 will typically comprise microstructures formed during prior manufacturing steps. For example, prior to the superposition of first layer 220, substrate 204 may already include source and drain regions, and it may already include the substrate components for a memory array, or components for other circuits or devices. Moreover, additional layers or structures 224 may be superposed above the upper surface 212 of third layer 222. Therefore, an embodiment of the invention includes the method of manufacturing a multi-layer assembly superposed on an existing substrate, which may itself already comprise multiple manufacturing steps, and/or multiple layers. Moreover, the embodiment may also comprise the multi-layer assembly having additional superposed layers or structures.

Figure 3:
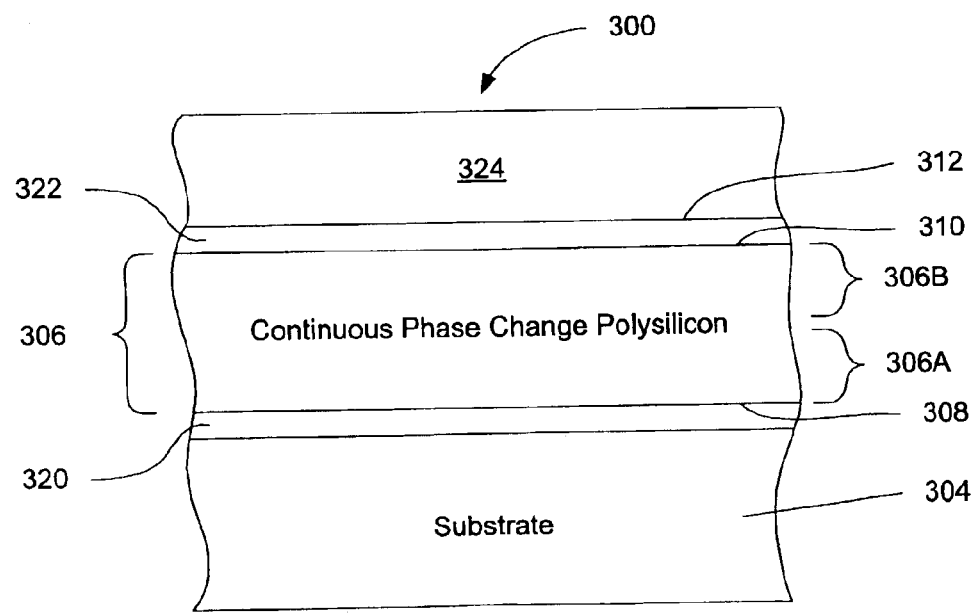
FIG. 3 illustrates the cross-section of a multi-layer assembly including layers formed by deposition in accordance with the invention.

FIG. 3 illustrates the cross-section of a multi-layer assembly 300 in another embodiment of the invention. The assembly comprises a substrate assembly 304 onto which a first layer 320 is superposed, and the first layer may comprise a dielectric such as an ONO layer, or may comprise another layer composition. In another embodiment of the invention, second layer 306 further comprising a continuous phase change polysilicon structure is superposed on first layer 320 by deposition, using an RTP (Rapid Thermal Processing) system, in which the deposition process starts at a temperature of about 620° C., and ends at a temperature in the range of about 550° C. to about 520° C. The process is performed in this manner, because the temperature range chosen causes the deposition of a continuous phase change polysilicon second layer, having a polysilicon first region 306A, adjacent to a first surface 308 of the second layer, and an amorphous silicon second region 306B adjacent to a second surface 310 of the second layer.

As with the embodiment of FIG. 2, the depiction in FIG. 3 of multi-layer assembly 300 is not limiting. Substrate assembly 304 may typically include features formed during prior manufacturing steps, and additional layers or structures 324 may be superposed on the upper surface 312 of third layer 322. Therefore, another embodiment of the invention includes the method of manufacturing a multi-layer assembly superposed on an existing substrate, which may itself already comprise multiple steps, and/or multiple layers. The embodiment may also include the multi-layer assembly having additional superposed layers or structures.

Figure 4:
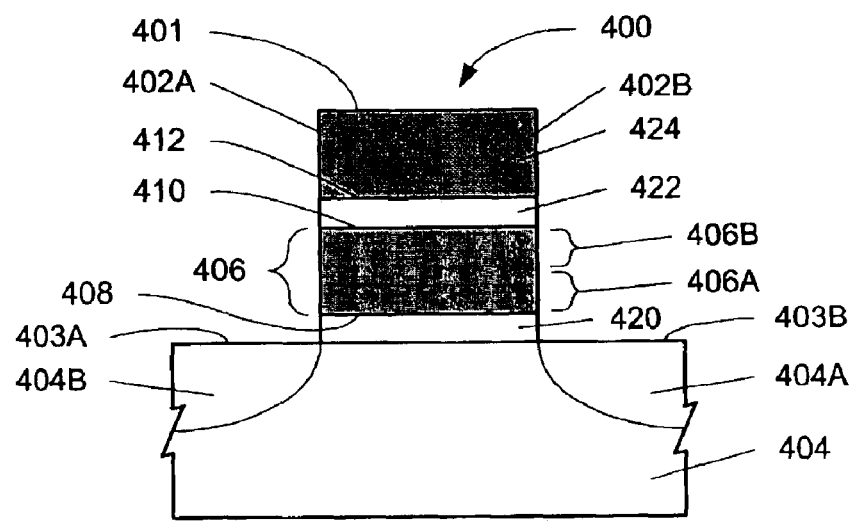
FIG. 4 depicts a cross-section of a floating gate transistor including drain and source regions.

FIG. 4 depicts a cross-section of a floating gate transistor microstructure 400 in one embodiment of the invention. The assembly comprises a substrate 404, which further comprises drain and source regions 404A–B. Floating gate transistor 400 comprises an ONO tunnel oxide layer 420 superposed on the substrate 404, and further comprises a polysilicon floating gate 406 superposed on the tunnel oxide layer 420. Control element 424, which may consist of a polysilicon layer, is superposed on an ONO interpoly dielectric layer 422, which in turn is superposed on floating gate 406.

The floating gate 406 has a first region 406A adjacent to first surface 408, and a second region 406B adjacent to second surface 410. According to an aspect of the invention, the first region is deposited under conditions favoring the formation of polysilicon, and the second region is deposited under conditions favoring the formation of amorphous silicon.

Figure 5:
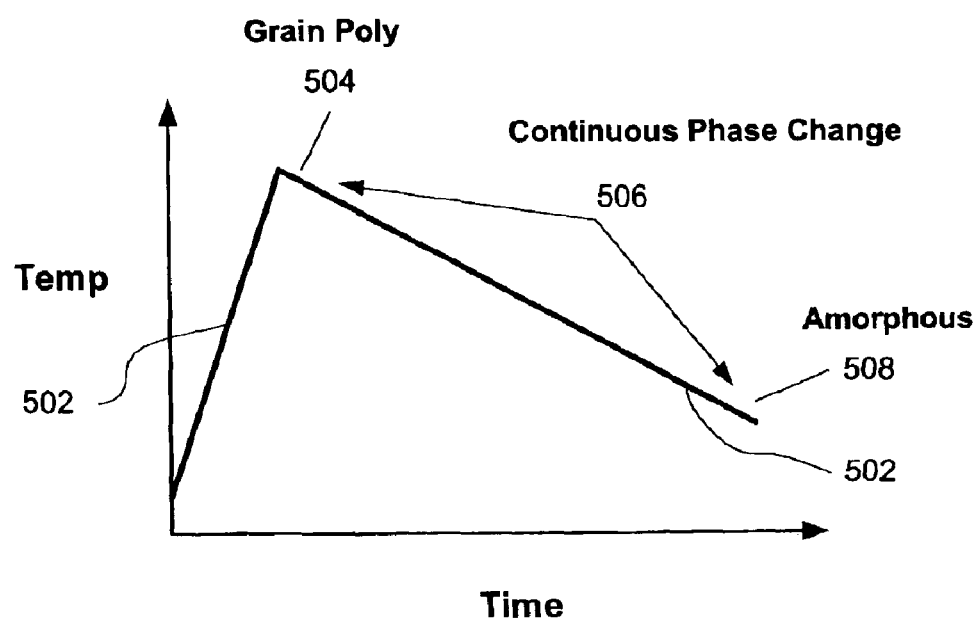
FIG. 5 corresponds to a possible temperature profile for an RTP system used for the deposition of a continuous phase change polysilicon layer.

FIG. 5 illustrates a possible temperature profile 502 for an RTP system, which can be used during the deposition of the floating gate layer, thereby forming the continuous phase change polysilicon layers 306 and 406 of FIGS. 3 and 4. In FIG. 5, the X-axis represents time, and the Y-axis represents temperature. In one embodiment of this aspect of the invention, the deposition process occurs during a decreasing temperature gradient 506 having a starting temperature 504 of approximately 620° C., and an ending temperature 508 approximately in a range of about 520° C. to 550° C. Polysilicon is deposited at the higher temperature 504, whereas at the lower temperature 508, amorphous silicon is deposited. During transition 506, from the higher to the lower temperature, the deposited material gradually transitions from polysilicon in the first region to amorphous silicon in the second region, thereby forming an approximately monotonic crystalline gradient from the first regions to the second regions of the deposited layer.

It is not necessary that all embodiments of the invention have a linear temperature decrease as shown in FIG. 5; preferably, though, the temperature decrease is monotonic. However, a monotonic temperature decrease is not an absolute requirement, as there may be temperature discontinuities, steps, or alternate profiles. For example, FIGS. 7 and 8 illustrate operating temperature profiles for other possible embodiments of the invention.

Figure 6:
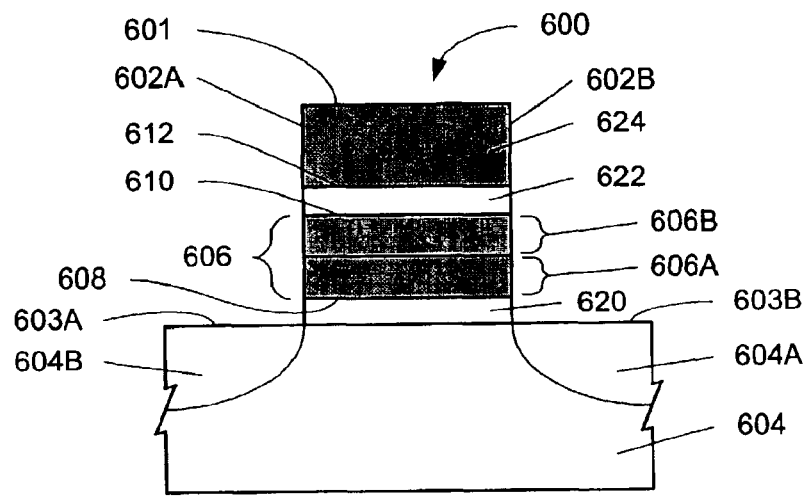
FIG. 6 corresponds to a possible temperature profile for an RTP system used for the deposition of a continuous phase change polysilicon layer.

FIG. 6 is a cross-section diagram of a floating gate transistor microstructure 600, according to another embodiment of the present invention. The assembly comprises a substrate 604, which includes drain and source regions 604A–B. The transistor includes an ONO tunnel oxide layer 620 superposed on the substrate 604, and further comprises a floating gate 606 superposed on the tunnel oxide layer 620. Control element 624, which may be a polysilicon layer, is superposed on an ONO interpoly dielectric layer 622, which is in turn superposed on floating gate 606.

The floating gate 606 comprises a first region 606A adjacent to a first surface 608 of the floating gate 606, and to a second region 606B adjacent to a second surface 610 of the floating gate 606. The first region 606A is primarily amorphous silicon. As with the embodiment of FIG. 4, the polysilicon microstructure adjacent to the first surface 608 resists the formation of tips on sidewall etch, and the amorphous silicon microstructure adjacent to the second surface 610 provides a smooth surface 610 for improved smoothness and uniformity of the superposing gate dielectric layer 622.

Figure 7:
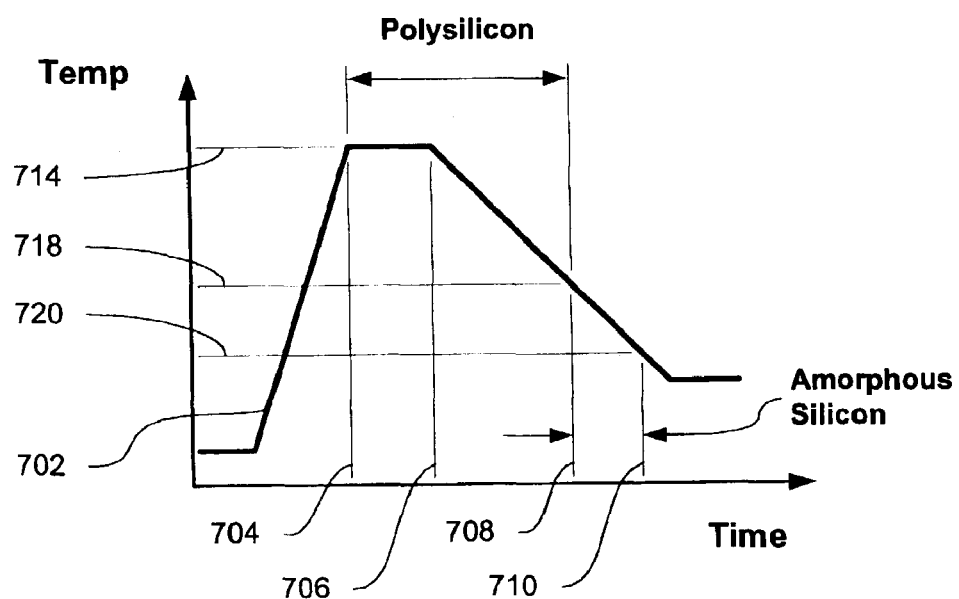
FIG. 7 corresponds to a possible temperature profile for an RTP system used for the deposition of a continuous phase change polysilicon layer.
Figure 8:
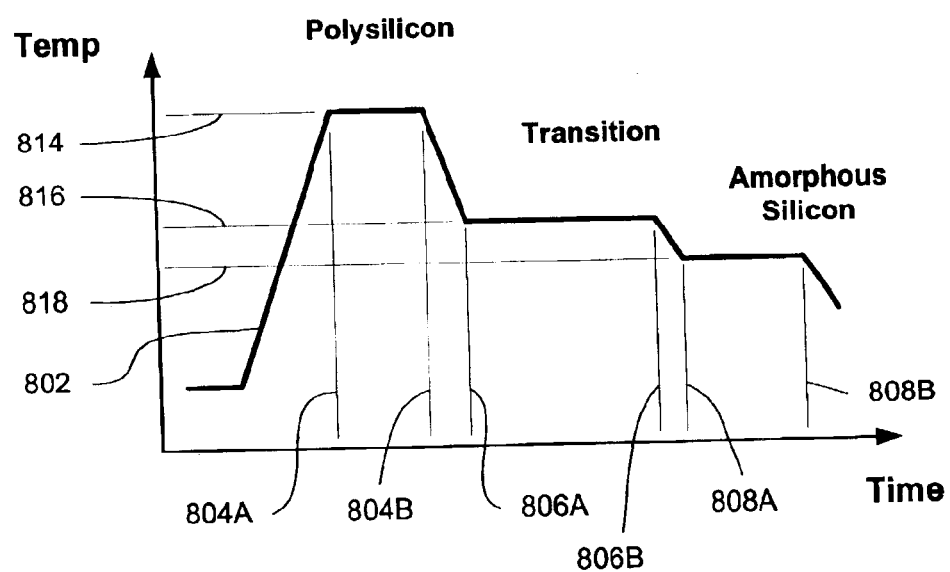
FIG. 8 corresponds to a possible temperature profile for an RTP system used for the deposition of a floating gate polysilicon film.

FIG. 7 shows another possible temperature profile 702 of an RTP system, according to an aspect of the invention, for the deposition of a continuous phase change polysilicon layer as shown in FIGS. 3 and 4. The X-axis represents time, and the Y-axis represents temperature. In one embodiment of the invention, the deposition process temperature profile has a starting temperature 714 of approximately 620° C., and an ending temperature 720 approximately in a range of about 550° C. to S20° C., and the deposition process takes place during an interval corresponding to a starting time 704 and an ending time 710.

Referring to FIGS. 4 and 7, formation by deposition of the first region 406A, of the floating gate 406, takes place during a first interval lasting from about time 704 to about time 706, starting with formation of the first surface 408, deposited on tunnel oxide layer 420. During the first interval, the temperature is maintained at about starting temperature 714. Controlling the temperature to keep it approximately constant during the period of time from 704 to 706, during the initial deposition of the first gate region, promotes development of a certain thickness of the region adjacent to the first surface 408, which therefore results in a desired grain structure, which reduces tip formation during subsequent etching steps, when sidewalls 602A and 602B are formed. Moreover, in-situ doping of the lower region may also be performed during this deposition process.

The first interval is followed by a second interval, lasting from about time 706 to about time 708, during which the temperature is reduced gradually from the starting temperature 714 to temperature 718. Polysilicon is being deposited when reduction of the temperature starts at about time 706; however, when the temperature reaches the range 708 to 710, the deposition is forming amorphous silicon. In the range starting at about 706, and ending at about 708 to 710, a continuous phase-change region is being deposited, with crystalline properties which start as polysilicon and end as amorphous silicon.

Referring to FIGS. 4 and 7, formation by deposition of the second region 606B of the floating gate, comprising amorphous silicon, takes place during a third interval lasting from about time 708 to about time 710, during which the process temperature is controlled to follow a decreasing profile, starting at a temperature 718 of about 550° C., and ending at a temperature 720 of about 520° C. Furthermore, in-situ doping of the second region may be performed during the deposition process.

Accordingly, one embodiment of the invention provides for the formation of a polysilicon floating gate microstructure comprising upper and lower portions; wherein the lower portion 406A is composed of random grain polysilicon, and the upper portion 406B is composed of amorphous silicon.

FIG. 8 corresponds to another possible temperature profile 802 for an RTP system, when used for the deposition of a floating gate polysilicon film. The X-axis represents time, and the Y-axis represents temperature. In one embodiment of the invention, the deposition process temperature profile has a starting temperature 814 of approximately 620° C., and an ending temperature 818 approximately in a range of about 550° C. to 520° C., and takes place during an interval corresponding to a starting time 804A and an ending time 808B.

Referring to FIGS. 6 and 8, formation by deposition of the first region 606A of the floating gate takes place during a first interval lasting from about time 804A to about time 804B, starting with formation of the first surface 608, superposed on tunnel oxide layer 620. During this first interval, the temperature is maintained at about starting temperature 814. Moreover, in-situ doping of the lower region may be performed during the deposition of the lower region.

The end of the first interval is followed by a transition in the temperature from starting temperature 814 to an intermediate temperature 816, and this transition occurs during a second interval lasting from about time 804B to about time 806A. An intermediate temperature 816 is kept approximately stable during a third interval, lasting from about time 806A to about time 806B. Although FIG. 8 illustrates an intermediate temperature 816 that appears to be lower than initial temperature 814, this pictorial feature is not intended to be limiting. To the contrary, intermediate temperature 816 may be higher or lower than initial temperature 814, as may be necessary to perform a desired annealing, conditioning, or other types of processing. The end of the third interval is followed by another transition in the temperature from the intermediate temperature 816 to the ending temperature 818, in a range of about 550° C. to 520° C., and this transition occurs during a fourth interval lasting from about time 806B to about time 808A. Optionally, process deposition, doping, etc. can also take place during the transition and intermediate regions 804B to 808A.

Formation by deposition of the transistor floating gate second region 606B, comprising amorphous silicon, takes place during a fifth interval lasting from about time 808A to about time 808B, during which the temperature is kept stable at about the ending temperature 818, which may be in a range of about 520° C. to 550° C. Furthermore, in-situ doping of the upper region may be performed during the deposition of the upper region.

Figure 9:
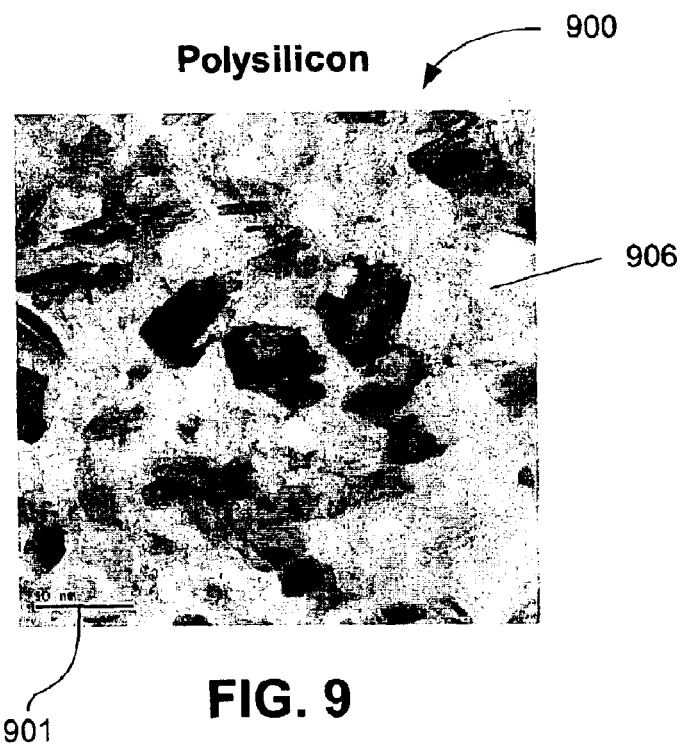
FIG. 9 depicts the plan view of a polysilicon structure.

FIG. 9 is a TEM micrograph 900, depicting the plan view of a polysilicon structure, wherein scale 901 represents 50 nm. Plan view 906 show the "grainy" composition of the polysilicon layer 906 at surface 408 or 608 of floating gate 406 or 606, respectively (FIGS. 4 and 6). It is believed that the coarse grain structure of the polysilicon favors smoother floating gate sidewalls near the tunnel dielectric layer 420 or 620 on etching.

Figure 10:
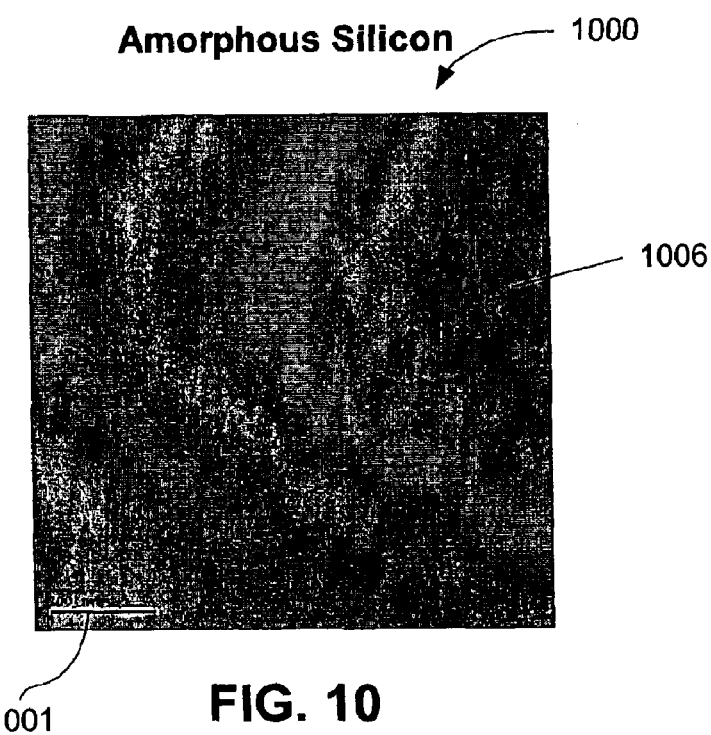
FIG. 10 depicts the plan view of an amorphous silicon structure.

FIG. 10 is a TEM micrograph 1000, depicting the plan view of an amorphous silicon structure, wherein scale 1001 represents 100 nm. Plan view 1006 illustrates the reduced presence and size of grains in an amorphous silicon structure relative to the grain sizes of the polysilicon structure illustrated in FIG. 9. The smoother microstructure of amorphous silicon at surface 410 or 610 of floating gate 406 or 606, respectively, is believed to provide a more desirable foundation for the formation of smoother ONO control dielectric layers 422 and 622.

Accordingly, it is believed the formation of a silicon layer that transitions from polysilicon at one surface to amorphous silicon at the opposite surface, addresses the two seemingly contradictory objectives of reduced tip adjacent the tunnel dielectric layer and improved smoothness adjacent the gate dielectric layer, and that temperature control during the deposition of the silicon layer can provide the appropriate transition.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A multi-layer assembly comprising:

a first silicon layer comprising at least first and second surfaces, and further comprising a structure having a first region composed of amorphous silicon adjacent to the first surface, a second region composed of polysilicon adjacent to the second surface, and an intermediate region between the first and second regions, the intermediate region comprised partially of amorphous silicon and partially of polysilicon;

a second layer adjacent to the first surface of the first layer; and a third layer adjacent to the second surface of the first layer;

wherein at least one of the second and third layers comprises a dielectric.

2. A multi-layer assembly as in claim 1, wherein the intermediate region has a continuous phase distribution from amorphous silicon to polysilicon.

3. A semiconductor device having a floating gate, the floating gate comprising a silicon structure having at least first and second surfaces;

the structure comprising at least first and second regions;

the first region comprising amorphous silicon, and adjacent to the first surface; and the second region comprising polysilicon, and adjacent to the second surface, the silicon structure further comprising an intermediate region between the first and second surfaces, wherein the intermediate region has a phase distribution that transitions from amorphous silicon to polysilicon.

4. A method of forming a layer on a substrate, comprising:

depositing a silicon layer on the substrate; and controlling the temperature during the step of depositing the silicon layer, from a starting temperature favoring the formation of polysilicon, to an ending temperature favoring the formation of amorphous silicon.

5. A method as in claim 4, wherein:

the starting temperature is approximately 620° C.; and the ending temperature is in a range from about 500° C. to about 550° C.

6. A method of forming a floating gate on a semiconductor substrate, comprising:

forming a first dielectric layer on the semiconductor substrate;

depositing a silicon layer superposing the first layer;

forming a second dielectric layer superposing the silicon layer; and controlling the temperature during the step of depositing the silicon layer, from a starting temperature to an ending temperature, wherein the starting temperature is higher than the ending temperature.

7. A method as in claim 6, wherein:

the starting temperature is selected to form a polysilicon region adjacent to the first dielectric layer; and the ending temperature is selected to form an amorphous silicon region adjacent to the second dielectric layer.

8. A method as in claim 7, wherein:

the starting temperature is approximately 620° C.; and the ending temperature is in a range from about 500° C. to about 550° C.

* * * * *